United States Patent [19]

Brahm et al.

[11] Patent Number: 4,654,820
[45] Date of Patent: Mar. 31, 1987

[54] INTERRUPT BUS STRUCTURE

[75] Inventors: David J. Brahm, Naperville; Don R. Draper, Lisle; Christopher Edmonds, Batavia; James M. Grinn, Warrenville, all of Ill.

[73] Assignee: AT&T Bell Laboratories, Murray Hill, N.J.

[21] Appl. No.: 556,350

[22] Filed: Nov. 30, 1983

[51] Int. Cl.[4] ............................................. G06F 13/00
[52] U.S. Cl. .................................... 364/900; 361/400; 361/393
[58] Field of Search ... 364/200 MS File, 900 MS File; 361/393, 400, 407, 412, 413, 416, 415; 339/17 R, 17 C, 18 P, 18 C

[56] References Cited

U.S. PATENT DOCUMENTS

| 3,881,174 | 4/1975 | Barnich | 364/200 |
| 4,025,903 | 5/1977 | Kaufman et al. | 364/200 |
| 4,237,535 | 12/1980 | Wiedenman | 364/200 |
| 4,268,906 | 5/1981 | Bourke et al. | 364/200 |
| 4,296,464 | 10/1981 | Woods et al. | 364/200 |
| 4,309,754 | 1/1982 | Dinwiddie, Jr. | 364/200 |
| 4,326,250 | 4/1982 | McCullough | 364/200 |
| 4,398,246 | 8/1983 | Frediani et al. | 364/200 |
| 4,415,986 | 11/1983 | Chadra | 364/200 |
| 4,418,386 | 11/1983 | Vrielink | 364/200 |
| 4,470,114 | 9/1984 | Gerhold | 364/200 |
| 4,511,950 | 4/1985 | Bunner et al. | 361/412 |

FOREIGN PATENT DOCUMENTS 2441786  3/1976  Fed. Rep. of Germany .

OTHER PUBLICATIONS

"HP 2700 Manual", pp. 1-1 through 1-11, 2-1 and 2-2, Hewlett Packard.
Motorola Brochure, BR 164.
Electronik, vol. 28, No. 10, May, 1979 (Munich, DE) Waltring: "Der Interrupt-Controller-ein Baustein, der fur Ordnung sorgt", pp. 73-80.
Research Disclosure, No. 161, Sept., 1977 (London, GB) Burns et al.: "Circuitry for Connecting a Plurality of Peripheral Devices as a Single Load on an Asynchronous Computer Bus", p. 13.
Electronics International, vol. 55, No. 26, Dec., 1982 (New York, US) Rau: "Advanced Processor-Independent Bus Rides on Eurocard Hardware", pp. 63-66.
IEEE Computer Society International Conference, Conf. 10, Computer Technology to Reach the People, San Francisco, Feb. 25-27, 1975, Spring Meeting (New York, US) Baum et al. "Hardware Considerations in a Microcomputer Multiprocessing System" pp. 27-30.

Primary Examiner—James D. Thomas
Assistant Examiner—Thomas C. Lee
Attorney, Agent, or Firm—Peter Visserman

[57] ABSTRACT

In a processor system having a central processor and secondary support processor mounted on a backplane board, a separate peripheral interrupt bus is provided for each secondary support processor to give full interrupt priority capability to peripheral devices connected to the support processors. The support processors (110, 120) and certain of the system's peripheral interface circuits (102, 104) are connected to the system's central processor (101) via a primary interrupt bus (105) and other peripheral interface circuits (112, 114, 122) are connected to their associated secondary processors (110, 120) via separate interrupt buses (115, 125) all on the same backplane board. The backplane board is divided into an upper section and a lower section and the primary interrupt bus and the interrupt request and acknowledge terminal pins for all circuit boards are in the lower section. The secondary processor boards and interface circuit boards served by the central processor have interrupt request and acknowledge terminal pins connected to the primary interrupt bus in the lower section. The interrupt request and acknowledge terminal pins for any peripheral interface circuit served by a secondary processor are connected to the associated secondary processor via a secondary interrupt bus formed in the upper section of the backplane and conductors extending between the sections.

1 Claim, 6 Drawing Figures

INTERRUPT BUS STRUCTURE

CROSS-REFERENCE TO RELATED APPLICATION

The following is a related application assigned to the same assignees as this application:

D. J. Brahm, J. M. Grinn, E. L. Hepler, and E. P. Schan, entitled "Multiprocessor Computing System Featuring Shared Global Control", Ser. No. 430,681 filed Sept. 30, 1982.

TECHNICAL FIELD

The invention relates to processor systems and, in particular, to interrupt signal communications arrangements between processors and peripheral equipment.

BACKGROUND OF THE INVENTION

In modern processor systems, peripheral units include a variety of input/output terminals and mass storage devices operating under the control of peripheral device controllers such as disk or tape controllers. Many peripheral units are semi-autonomous and require the attention of the system's central processor only for a relatively small period of the total processing time available to the system. Typically, a peripheral unit will act on command from the central processor or in response to external stimuli. In either case, the peripheral unit usually performs some autonomous tasks and signals the processor when further attention by the processor is needed. This signaling is commonly done with an interrupt request to the processor. The processor will acknowledge concurrent interrupt requests from different peripheral units in accordance with a predetermined priority scheme assigned on the basis of the type and activity of the requesting device.

Modern processor systems generally consist of integrated circuits mounted on circuit boards. In some arrangements, an entire processor may be mounted on a single board which, in turn, is plugged into a so-called backplane. The computer's peripheral units are connected to peripheral interface circuit boards which are also plugged into the same backplane board as the processor. Interconnecting buses including address and data buses for transferring information between circuit boards, and an interrupt bus used to communicate interrupt request and acknowledge signals between the interface circuit boards and the processor, are formed on the backplane. The interrupt bus includes a communication path to transmit interrupt request signals from peripheral unit interface boards to the processor and a path to transmit acknowledge signals from the processor to the interface boards.

As the number of peripheral units of a processor increases, the processor's peripheral communication overhead increases as well. To alleviate this problem, some prior art arrangements use secondary support processors, connected to the interrupt bus of the central processor, which handle a part of the peripheral unit communications. The central processor, the secondary processors and all of the system's peripheral interface circuits are interconnected by an address/data bus which allows communication among the various units. The secondary processors and certain of the system's peripheral interface circuits are connected to the central processor's interrupt bus, and are capable of interrupting the central processor; however, certain other peripheral units have no connection to the central processor's interrupt bus. Interrupt communications with these other units are controlled from the secondary processors by "polling", that is, reading certain status bits within the peripheral units via the address/data bus. While this scheme relieves the primary processor of some of the tasks associated with serving peripheral equipment, it does not allow the peripheral units served by secondary processors to initiate interrupts and no provision exists for conveniently allowing distinct levels of interrupts for different peripheral units connected to the secondary processors.

SUMMARY OF THE INVENTION

An interrupt bus structure in accordance with this invention, comprises a primary interrupt bus and a secondary interrupt bus on a backplane printed circuit board. Interrupt terminal pins of a secondary processor location on the backplane board are connected to interrupt pins of the central or primary processor location by the primary interrupt bus and interrupt pins of an interface circuit location are connected to interrupt pins of the secondary processor by a secondary interrupt bus. Advantageously, the secondary interrupt bus is isolated from the primary interrupt bus on the same backplane and provides a plurality of distinct interrupt levels to the secondary processor. This allows the peripheral interface circuits to interrupt the secondary processor in accordance with a desired interrupt priority scheme.

In one particular embodiment of the invention, the primary interrupt bus is arranged to communicate interrupts for certain of the system's peripheral interface circuits and the secondary processors, to the system's central processing unit. The separate secondary interrupt bus is used to communicate interrupts for other peripheral interface circuits to the secondary support processor. Advantageously, interrupt requests from the secondary processor are served as peripheral interrupts by the central processing unit on the primary interrupt bus, and the secondary processor serves one or more peripheral interface circuits by means of the secondary interrupt bus, while all of the processors and peripheral units are connected to a common address and data bus.

In one specific implementation, the primary and secondary interrupt buses are formed on a printed circuit board backplane having a plurality of circuit board locations and the backplane is divided into an upper section and a lower section. Interrupt terminals of all of the circuit board locations are in the lower section of the backplane and the interrupt request and acknowledge terminal pins of the secondary processor circuit board location are connected to the primary interrupt bus, which is formed in the lower section of the backplane board. The interrupt request and acknowledge terminal pins for peripheral interface board locations are connected to pins of the secondary processor location via the secondary interrupt bus formed in the upper section of the backplane board. Several secondary processors may be used, each having a secondary interrupt bus isolated from other secondary interrupt buses. For each secondary bus, conductors are extended from terminal pins in the lower section to corresponding conductors of the secondary bus in the upper section. Advantageously, in such an arrangement, connections between the two sections may be made by printed wiring interconnect plug boards pluggably connectable to the pins.

Advantageously, in a system in accordance with this invention peripheral device interrupts may be served by a secondary processor in accordance with a predetermined interrupt priority scheme in the same manner as peripheral devices served by the central processing unit. Furthermore, any peripheral interface board may be positioned in the various slots of the backplane and by appropriate backplane strapping, may have interrupt communication with any of the processors without modification of any circuit board or connectors. It is also an advantage of this invention that peripheral units may be added and interrupt priorities reassigned by means of wire straps or plug boards without expensive changes to the backplane. It is a further advantage of the bus structure of this invention that any number of secondary processors can be accommodated, each of which may have interrupt communications with any number of peripheral devices via a separate secondary interrupt bus, without interfering with the communication between the central processing unit and other peripheral devices.

These and other advantages of the invention will become apparent from the following description of an illustrative embodiment of the invention, taken together with the drawing.

DETAILED DESCRIPTION

Figure 1:
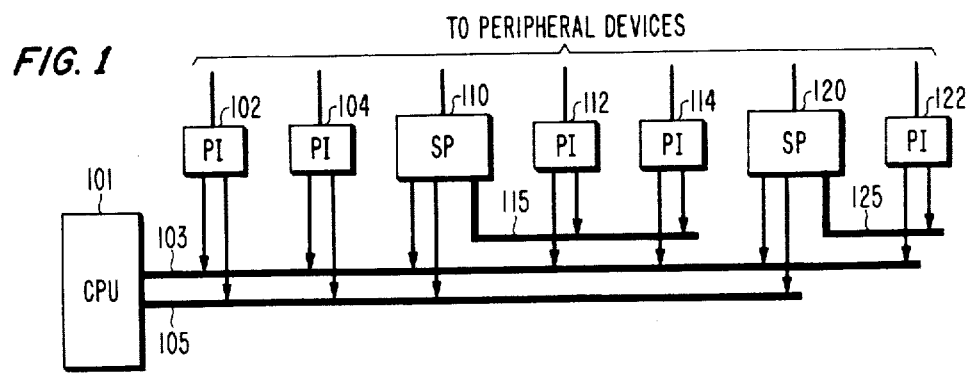
FIG. 1 is a block diagram of an illustrative processor interconnection arrangement in accordance with this invention.

Shown in FIG. 1 is an illustrative processor system comprising a central processing unit (CPU) 101 which is connected to peripheral interface circuits and secondary processors via and address/data bus 103. The peripheral interface circuits 102, 104, 112, 114 and 122 are standard circuits adapted to communicate with a plurality of peripheral devices such as disk and tape drives, printers and other input or output devices. Secondary processors 110 and 120 are incorporated in the system to handle interrupt communications with peripheral devices 112, 114 and 122. Primary interrupt bus 105 provides for interrupt communications between CPU 101 and peripheral interface circuits 102 and 104 as well as secondary processors 110 and 120. One secondary interrupt bus 115 provides for interrupt communications between secondary processor 110 and interface circuits 112 and 114. Another secondary interrupt bus 125 provides for interrupt communication between secondary processor 120 and peripheral interface 122. CPU 101 and processors 110 and 120 may be any well-known processor having standard interrupt handling and peripheral communication capabilities.

Figure 2:
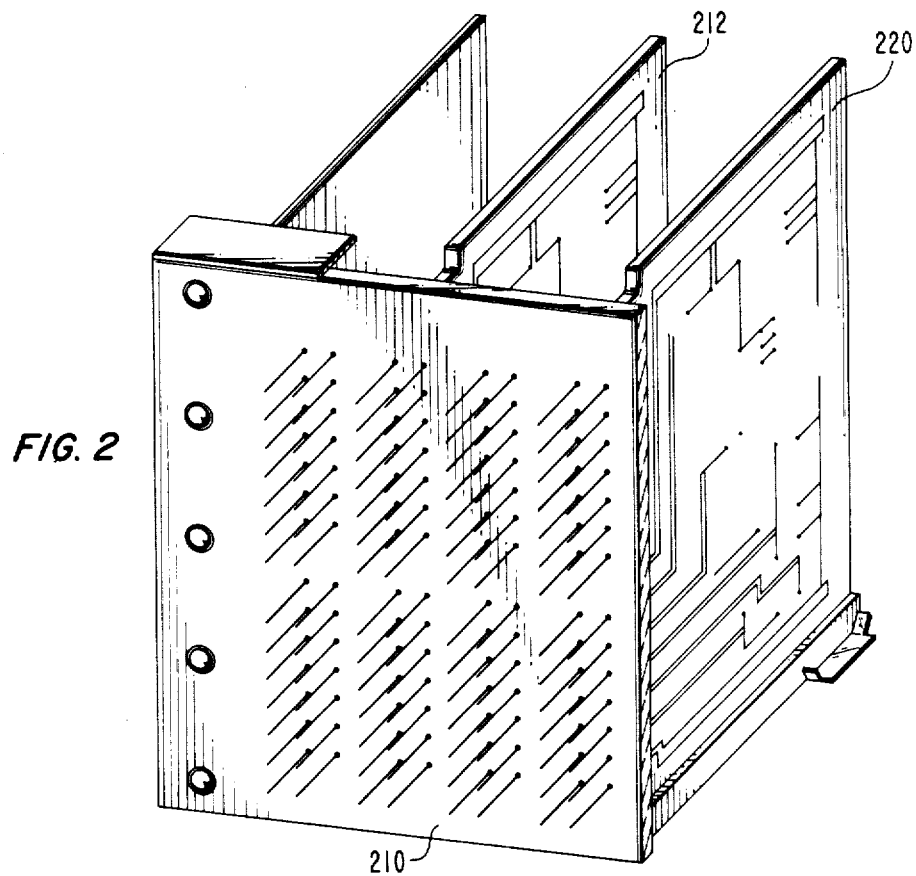
FIG. 2 is a perspective view of a typical backplane having circuit boards mounted thereon.

The interrupt buses 105, 115 and 125 may be part of a single printed wiring board, referred to as a backplane, to which a plurality of circuit boards are connected by means of standard circuit board connectors. Each of the units shown in FIG. 1, including the CPU 101, the interface circuits 102, etc. and the support processors 110, 120 are mounted on circuit boards and all the boards are pluggably connected to the backplane. A typical prior art arrangement of a representative number of circuit boards 212 and 220 mounted on backplane 210 is shown to illustrate the physical relationship between the circuit boards and the backplane in FIG. 2. The backplane has printed circuitry on the component side, i.e, the side on which the boards are mounted, and show essentially a large array of pins on the opposite side which is referred to as the wiring side of the backplane. By means of the printed circuitry on the component side of the backplane and appropriate interconnections between the pins on the other side, interrupt buses 105, 115 and 125 and address/data bus 103 are established on the backplane.

Communications between the circuits will include the transmittal of data as well as address information and interrupt signaling. Since the invention described herein relates to interrupt signaling, this description will concentrate on that part of the communications dealing with interrupt signaling. Interrupt signaling between a peripheral interface circuit and a processor in this implementation requires at least two separate communication paths. One path is used to send an interrupt request signal from the requesting circuit to the processor and the other path is used to provide an interrupt acknowledge signal from the processor in response to an interrupt request. Several such dual paths may be provided on the backplane to accommodate independent interrupt communications. Alternatively, a single pair may be used to handle interrupt communications for several peripheral interface circuits. In the latter case, the request leads from several units are connected to a common request path and the acknowledge path is connected to several units in a serial fashion. This is commonly referred to as a "daisy chain". All units connected to one path have the same priority level at the processor by which they are served. However, the first unit connected in the serial path which has made a request will respond to the interrupt acknowledge, thereby obtaining priority over other units in the serial path. In this illustrative system, secondary processors 110 and 120 each serve at least one interrupt requesting unit and these processors, in turn, are interrupt requesting units with respect to CPU 101.

Figure 3:
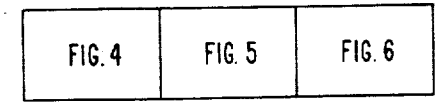
FIG. 3 shows the relative positions of FIGS. 4, 5 and 6.
Figure 4:
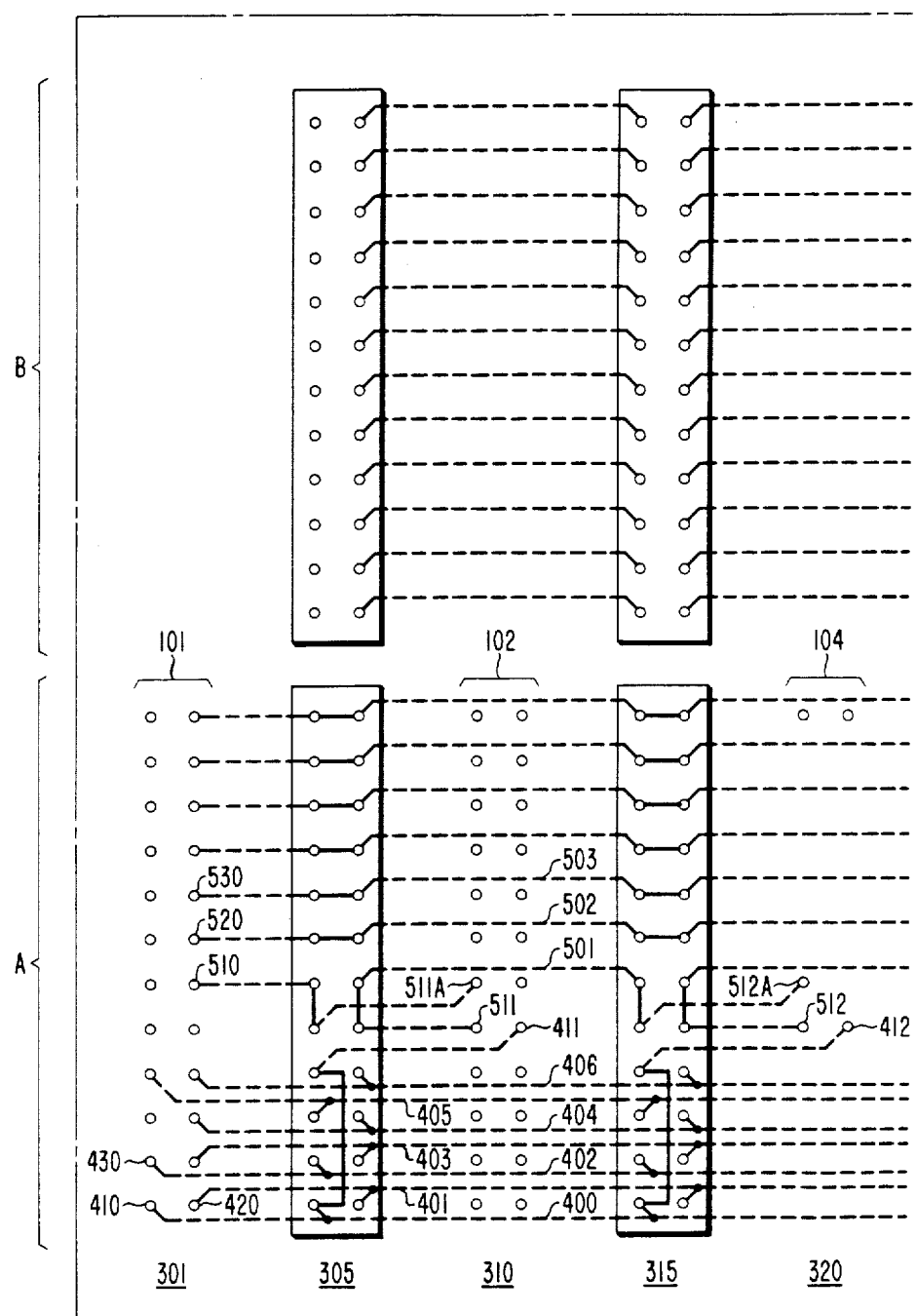
FIGS. 4, 5 and 6 show a portion of one side of a backplane having multiple interrupt buses.
Figure 5:
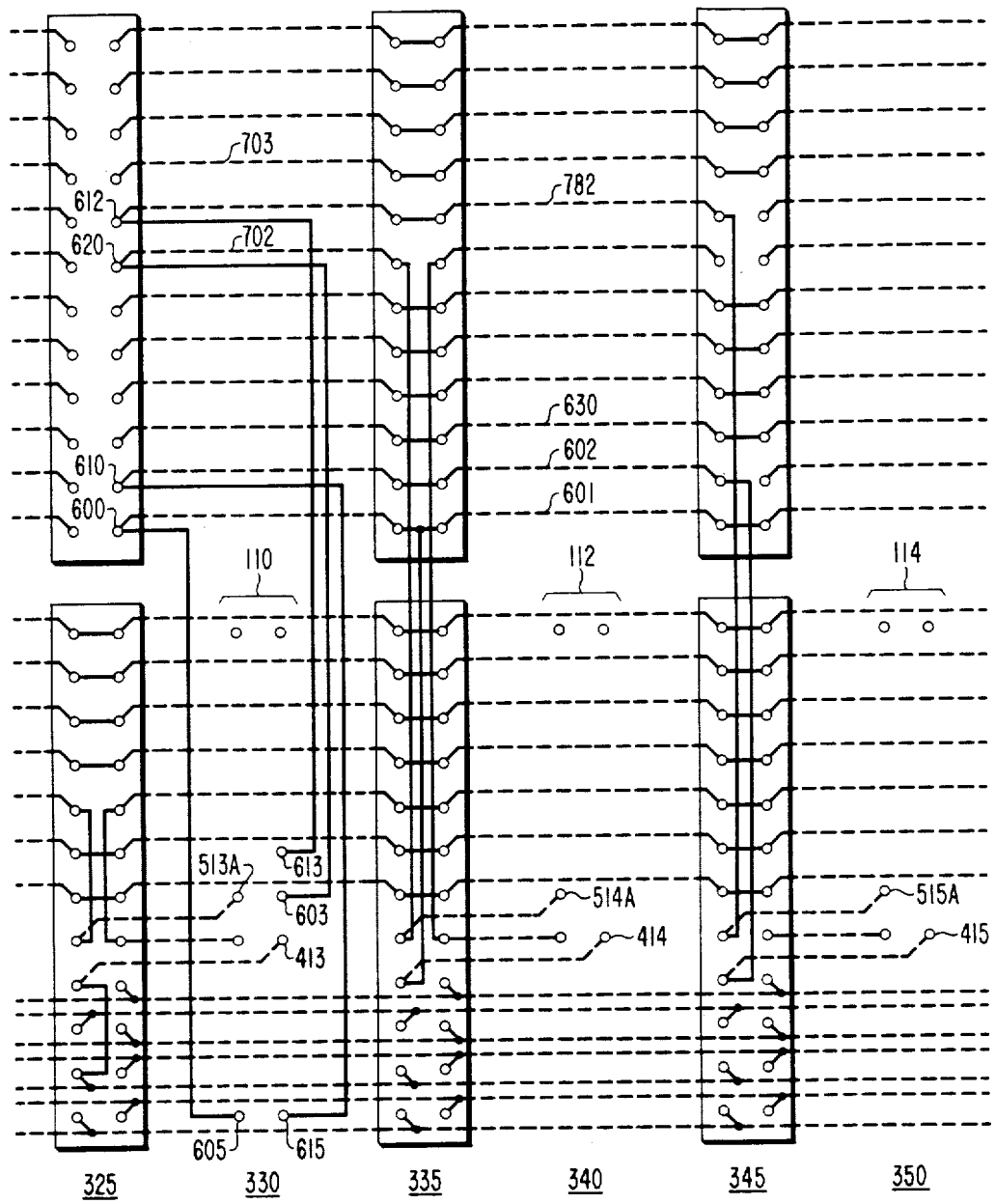
Figure 6:
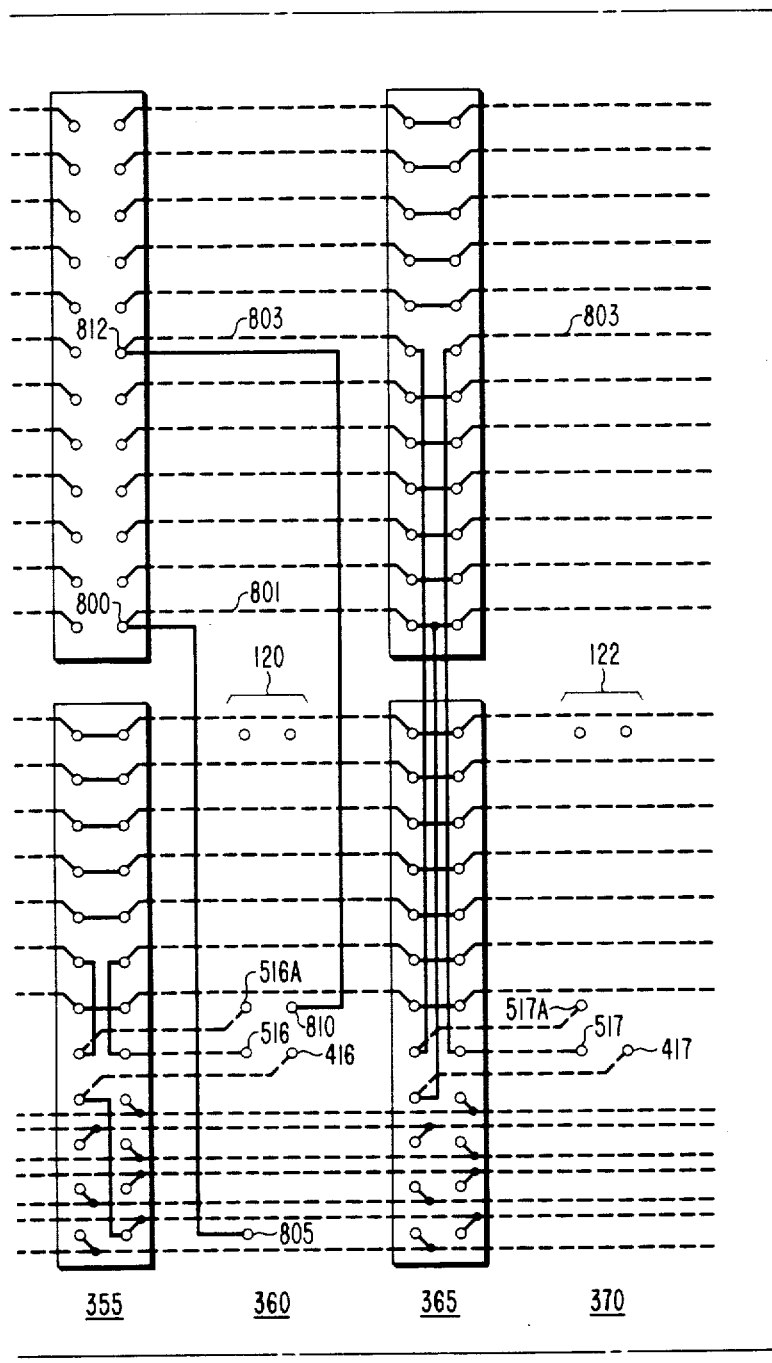

FIGS. 4, 5 and 6 arranged as shown in FIG. 3 represent a backplane which incorporates all three interrupt buses 105, 115 and 125. These figures show the wiring side or front side of the backplane and printed wiring paths are shown in dotted lines indicating that these are deposited on the other side, the component side, of the backplane. For the sake of clarity, only a representative number of the pins are shown in the drawing. The backplane as viewed from the front side, presents the top surface of several double columns of terminal pins 301, 305, etc. The first column, column 301 represents pins extending to the circuit board connector in which CPU 101 is mounted on the component side of the backplane. Pins in columns 310, 320, 330, 340, 350, 360, and 370 extend through the printed circuit board to other connectors in which the other circuit packs are inserted. Pins in columns 305, 315, 325, 335, 345, 355 and 365 are used to establish interconnections on the backplane and are not directly connected to any circuit pack. Interconnections are made between these pins by printed circuit conductors on the component side and shown as dotted lines, and by wire straps on the wiring side of the board shown as solid lines in the drawing. Instead of wire straps, interconnecting boards having printed circuit connections may be used to connect pins on the wiring side. The backplane printed circuit board will normally have interconnection leads for the transfer of addresses and data as well as for the handling of interrupt signaling. For the sake of convenience, only interrupt signaling connections, buses 105, 115 and 125, are shown in the drawing.

The backplane, as shown in FIGS. 4, 5 and 6, is divided into a lower portion labeled "A" in FIG. 4 and an upper portion labeled "B" in FIG. 4. The circuit board interrupt connectors for the CPU, the support processors and all of the I/O interface circuits are mounted in the lower portion. As will become apparent from the description in subsequent paragraphs, the distinction between interface circuits served by the CPU or one of the secondary processors is solely in the interconnections on the wiring side of the backplane. No distinction is made in the design of the connector or the circuit board between interface circuits served by CPU 101 and circuits served by a secondary processor. In this illustrative embodiment, the CPU 101 is connected to pins in column 301, secondary processors 110 and 120 are connected to pins in columns 330 and 360, respectively, and other columns are used for interface circuit connections. Any positions other than the CPU position can be used for an interface circuit or a secondary processor. Common pin layout may be advantageously used for the connector positions, for pins such as interrupt request and acknowledge pins, to facilitate interchangeability.

The lower portion of the backplane, level A, includes interrupt requests and interrupt acknowledge leads of primary interrupt bus 105 and the interrupt connector pins of all the boards mounted on the backplane including units 112, 114, and 122 which are not connected to bus 105. The upper portion of the backplane, level B, provides connections for interrupt request and acknowledge leads for secondary interrupt buses 115 and 125 which connect support processors 110 and 120 to their associated interface circuits. Strapping wires or interconnecting boards employing printed circuits, are used to make a connection between connector pins in level A and the buses in level B.

Pins in column 310 extend to interface circuit 102 and include pin 411 which is connected to the interrupt request terminal of that unit. Pin 411 is connected by printed circuitry and a strap in column 305 to interrupt request bus 400. Bus 400 is a printed circuit bus extending to pin 410, one of several interrupt request input terminals of the CPU 101. The pins of column 320 extend to the interface circuits 104, including terminal pin 412, which is the interrupt request output terminal of unit 104. Terminal 412 is connected by means of printed circuitry and strapping in column 315 to interrupt request bus 400 and ultimately to CPU 101 via terminal 410. Interface circuits 102 and 104 are connected to the same interrupt request terminals of the CPU 101, in the so-called daisy chain connection. Interrupt requests from either unit are transmitted on bus 400 and interrupt acknowledge signals from the CPU 101 are transmitted from interrupt acknowledge output terminal pin 510 via bus 501 to both units. As is apparent from the drawing, the pin 510 is connected to pin 511A, which extends to the interrupt acknowledge input terminal of the unit 102. The acknowledge signal is used by unit 102 in a well-known manner if this unit has initiated an interrupt request. Otherwise, the signal is transmitted by unit 102 to unit 104 via interrupt acknowledge output pin 511 and bus 501 to acknowledge input pin 512A. The request bus 400 and acknowledge bus 501 may both be extended to other circuit packs. In that case, an acknowledge signal not used by unit 102 or 104 is passed on to other units connected to the bus.

As shown in FIG. 1, secondary processors 110 and 120 are also connected to interrupt bus 105. The secondary processor 110 is connected to connector pins in columns 330, FIG. 5, and secondary processor 120 is connected to connector pins in column 360, FIG. 6. Both of these processors appear to CPU 101 as peripheral devices, but have the role of processor with respect to peripheral devices served by them. Consequently, these processors are provided with an interrupt request output and an acknowledge input terminal for communicating with CPU 101 and are provided with interrupt request input terminals and acknowledge output terminals, in the same manner as CPU 110, for communication with the interface circuits. Both secondary processors are connected to CPU 101 by means of the primary interrupt bus in level A. In this illustrative embodiment, independent interrupt request and acknowledge paths are used between the CPU 101 and these processors. A daisy-chain connection could be used as well, connecting the interrupt path to the CPU 110 from one of the secondary processors in series with the other or with the interface circuits 102 and 104.

Interrupt request output terminal 413 of secondary processor 110 is connected via pins in column 325 and request bus 402 to interrupt request input terminal 430 of CPU 101. Acknowledge input terminal 513A of processor 110 is connected via acknowledge bus 503 to acknowledge output terminal 530 of CPU 101. Similarly, interrupt request output terminal 416 of processor 120 is connected to interrupt request input terminal 420 of CPU 101 via bus 401, and acknowledge input terminal 516A of processor 120 is connected to acknowledge output terminal 520 of CPU 101 via bus 502.

The interface circuits 112, 114 and 122 and secondary processors 110 and 120 are all plugged into the backplane in the A level in the same manner as all other circuit packs mounted on the backplane. However, these units are interconnected via the B level. More specifically, interrupt request output terminal 414, in columns 340 in level A, belonging to interface circuit 112 is connected to interrupt request buses 601 in level B. Likewise, interrupt request output terminal 415 in column 350, level A, belonging to interface circuit 114 is connected to interrupt request bus 602 in level B. Bus 601 extends to terminal 600 in level B, column 325, and is connected to terminal 605 in level A, column 330, by means of strapping wire. Similarly, bus 602 extends to terminal 610 in level B, column 325, and is connected to terminal 615 in level A, column 330, by means of strapping wire. Terminal pins 605 and 615 are interrupt request input terminals for secondary processor 110. When the secondary processor 110 is ready to respond to an interrupt request from interface circuit 112, it will transmit an acknowledge signal on terminal 603 in level A, column 330. This terminal is connected by means of a wiring strap to terminal 620 in level B, column 325, and from there via acknowledge bus 702 to a terminal pin in column 335, level B, and via a strap to a pin in column 335, level A and to terminal 514A in level A, column 340. This is the interrupt acknowledge input terminal of interface circuit 112. In a similar manner, another acknowledge terminal of secondary processor 110 is connected to terminal 613 in column 330, level A, which is connected to pin 612 in level B, column 325, and to acknowledge bus 782. A connection is established in column 345 from bus 782 in level B to the acknowledge input terminal 515A of the interface circuit 114 in level A.

Shown in FIG. 6 are interconnections from connector terminal pins of interface circuit 122 in column 370, to secondary processor 120 which is connected to pins of column 360. In the arrangement shown in FIG. 6, the interrupt request output terminal 417 of interface circuit 122 is connected via pins in column 365 in level A and a wiring strap, to request bus 801 and terminal pin 800, column 355, in level B. Terminal pin 800 is connected, via a wiring strap from level B to level A, to terminal pin 805 in column 360, level A, which is one of the interrupt request input terminals of secondary processor 120. The secondary processor 120 is adapted to send an interrupt acknowledge signal via terminal 810 in column 360, level A, which is connected to terminal 812 in column 355, level B, which in turn is connected via bus 803 in level B and an interconnecting strap in column 365 to interrupt acknowledge terminal 517A of interface circuit 122. This circuit may be one of several such circuits connected in a daisy-chain connection. In that case, it will be adapted to transmit the acknowledge signal via terminal 517 in level A and via a strap in column 365 to bus 803 in level B for use by other interface circuits. As is apparent from the drawing, the lack of pin cross connections provides isolation of the interrupt bus for processor 120 from the interrupt bus of processor 110.

The backplane of FIGS. 4, 5 and 6 may be further extended beyond FIG. 6 to accommodate other interface circuits and secondary processors. It will be apparent from the drawing that other units could be connected to interrupt request leads for the CPU 101 as well as to interrupt acknowledge leads, on an extended backplane without interfering with existing units. Such additional units may include other secondary processors connected in the manner described above. Similarly, additional interface circuits could be connected to secondary processors 110 and 120. Furthermore, reassignment of peripheral devices to the CPU or to a secondary processor may be accomplished by changing only connections on the terminal pins on the backplane, without modification to connectors or the interface circuit boards.

Various other changes and modifications to the illustrative embodiment will be apparent to those skilled in the art without departing from the spirit and scope of the invention described herein. It is therefore intended that such changes and modifications be covered by the following claims.

What is claimed is:

1. An interrupt bus structure on a two sided backplane circuit board extending longitudinally in a predetermined direction and having a first backplane section extending in said predetermined direction and a second backplane section spaced apart from said first section and extending in said predetermined direction, said backplane circuit board having a first and a second side and having a plurality of circuit pack connectors on said first side of said backplane spaced along an axis extending in said predetermined direction in said first section including a primary processor connector for mounting a primary processor circuit pack, a secondary processor connector for mounting a secondary processor circuit pack, and a plurality of interface circuit connectors for mounting peripheral interface circuit packs, said primary processor connector comprising interrupt request input terminal pins and acknowledge output terminal pins, said secondary processor connector comprising an interrupt request input terminal pin and an acknowledge output terminal pin and an interrupt request output terminal pin and an acknowledge input terminal pin and said interface circuit connectors each comprising an interrupt request output terminal pin and an acknowledge input terminal pin, all of said terminal pins of said connectors extending from said connector to said second side of said backplane in said first section;

said bus structure comprising:

a primary interrupt bus in said first section for connecting said primary processor connector for interrupt communication with said secondary processor connector and a first of said interface circuit connectors, said primary interrupt bus comprising conductor means connecting said interrupt request output terminal pin of said secondary processor connector to an interrupt request input terminal pin of said primary processor connector, conductor means connecting said interrupt request output terminal pin of said first interface circuit connector to an interrupt request input terminal pin of said primary processor connector, conductor means connecting an acknowledge output terminal pin of said primary processor connector to said acknowledge input terminal pin of said secondary processor connector and conductor means connecting an acknowledge output terminal pin of said primary connector to said acknowledge input terminal pin of said first interface circuit connector, said primary interrupt bus providing interrupt request and acknowledge signaling paths between said primary processor connector and said secondary processor and said first interface circuit connectors in said first section; and a secondary interrupt bus for connecting a second of said interface circuit connectors for interrupt communication with said secondary processor connector and comprising:

on said second side and in said second section a group of terminal pins adjacent said secondary processor connector and a group of terminal pins adjacent said second interface circuit connector in said second section a plurality of interrupt request conductors and interrupt acknowledge conductors connecting different ones of the pins in the group of pins adjacent said secondary processor connector to different ones of the pins in the group adjacent said second interface circuit connector; and conductor means extending between pins in said first and said second sections connecting said interrupt request output and acknowledge input terminal pins of said second interface circuit connector in said first section to pins connected to the interrupt request and interrupt acknowledge conductors, respectively, in the group of pins in said second section adjacent said second interface circuit connector and connecting said interrupt request input and acknowledge output terminal pins of said secondary processor connector in said first section to pins connected to the interrupt request and interrupt acknowledge conductors, respectively, of said group of pins in said second section adjacent said secondary processor connector;

said secondary interrupt bus thereby providing interrupt request and acknowledge signaling paths between said secondary processor connector and said second interface circuit connector via said second section, whereby all circuit pack connectors, including connectors for mounting a primary processor circuit pack and for mounting a peripheral interface circuit pack designated for interrupt communication with a secondary processor, are spaced along an axis extending in a predetermined direction in the first section of the board, and interrupt connections to a primary processor are established via conductors in the first section and interrupt connections to the secondary processor are established via conductors in the second section and conductors extending between the two sections.

* * * * *